United States Patent [19]

Pilz

[11] 4,181,531

[45] Jan. 1, 1980

[54] POSITIVE NON-SILVER SYSTEMS CONTAINING NITROFURYLDIHYDROPYRIDINE

[75] Inventor: Otto Pilz, Langen, Fed. Rep. of Germany

[73] Assignee: E. I. Du Pont de Nemours and Company, Wilmington, Del.

[21] Appl. No.: 894,551

[22] Filed: Apr. 7, 1978

[51] Int. Cl.$^2$ .............................................. G03C 1/68
[52] U.S. Cl. .................................. 430/270; 430/292; 430/318; 430/302
[58] Field of Search ...................... 96/115 R, 88, 90 R

[56] References Cited

U.S. PATENT DOCUMENTS

| 3,901,710 | 8/1975 | Ranz et al. | 96/115 R |
| 3,923,522 | 12/1975 | Hata et al. | 96/115 R |

*Primary Examiner*—Won H. Louie, Jr.

[57] ABSTRACT

Positive working non-silver wash-out system based on 1,4-dihydro-4-(5'-nitro-2'-furyl)-pyridines. Such systems are useful in preparing positive working printing plates and photoresists.

6 Claims, No Drawings

POSITIVE NON-SILVER SYSTEMS CONTAINING NITROFURYLDIHYDROPYRIDINE

DESCRIPTION

1. Technical Field

This invention relates to new photosensitive elements, and pertains more particularly to positive-working photosensitive elements.

2. Background Art

Photosensitive compositions which change their solubility under the influence of radiation actinic to the composition are known in image reproduction technology. A negative or positive image is formed depending, respectively, on whether the solubility of the composition in a suitable solvent is decreased or increased. Compositions which yield negative images of the original are much more common than compositions which yield positive images.

One positive-working system is based on the photodecomposition of o-quinone diazides. The photodecomposition products occurring therein are more soluble in aqueous alkali than are the starting compounds. Another positive-working system is disclosed in U.S. Pat. No. 3,782,951 which describes a composition of a hexaaryldiimidazole, a hydrogen donor, an ethylenically unsaturated compound, and an organic polymeric binder.

Still another positive-working composition is known from German OS 2,242,106. This composition contains a 1,4-dihydro-4-(2'-nitrophenyl)-pyridine as the light-sensitive compound, and excels primarily in yielding a comparatively high light-sensitivity, and in requiring relatively simple processing. A disadvantage with this composition, however, is that the available solubility difference between exposed and unexposed image areas is not large enough for many practical applications. As a result of this small solubility difference, during the development process the unexposed areas will begin dissolving away before relief image formation is complete, thus leading to poorly formed relief, thin layers, and decreased image sharpness. These deficiencies can be very disadvantageous in various applications. Should the material, for example, be used for the preparation of printed circuits, then the light-sensitive layer remaining on the support after the development will start to dissolve and will be so thin that it no longer fully fulfills its purpose as a resist pattern. As a result there will be faulty etchings which impair the quality of the desired printed circuits. Should the layers be used for the preparation of offset plates, there will be no mechanical capacity to withstand stress which such plates undergo.

A substantial difference in the solubility of exposed and unexposed image areas, i.e., a wide processing latitude, thus is an essential requirement which must be fulfilled by a photosensitive stratum processed by the development procedure.

DISCLOSURE OF INVENTION

In accordance with this invention there is provided a photosensitive element for the preparation of positive images which comprises a support bearing a photosensitive layer comprising at least one polymeric binder and a dihydropyridine compound, the improvement being that the dihydropyridine compound is of the formula:

wherein
$R_1$ and $R_2$ are alkyl, aryl, substituted aryl and heterocyclic ring,
$R_3$ and $R_4$ are COOR', COR' and CN, R' is alkyl, substituted alkyl, or aryl,
and
$R_1$ and $R_3$ and/or $R_2$ and $R_4$ when taken together can form a 5- or 6-membered carbocyclic or heterocyclic ring.

Compounds of the invention defined above are summarized in the Table below. In $R_1$ and $R_2$ alkyl ranges from 1 to 20 carbon atoms, aryl ranges from 6 to 10 carbon atoms and substituted aryl ranges from 6 to 14 carbon atoms; in $R_3$ and $R_4$, R' is alkyl of 1 to 4 carbon atoms, substituted alkyl of 1 to 4 carbon atoms or aryl of 6 to 10 carbon atoms.

TABLE

| Compound No. | $R_1$ | $R_3$ |
|---|---|---|
| 1 | —CH$_3$ | —COOCH$_3$ |
| 2 | —CH$_3$ | —COCH$_3$ |
| 3 | —CH$_3$ | —COOC(CH$_3$)$_3$ |
| 4 | —CH$_3$ | —COOC$_2$H$_5$ |
| 5 | —C$_{17}$H$_{35}$ | —COOC$_2$H$_5$ |
| 6 | —C$_6$H$_4$—OCH$_3$ | —COOC$_2$H$_5$ |
| 7 | —C$_6$H$_4$—NO$_2$ | —COOC$_2$H$_5$ |
| 8 | —C$_4$H$_9$ | —COOC$_2$H$_5$ |
| 9 | —CH$_3$ | —CN |
| 10 | —CH$_3$ | —COOC$_2$H$_5$ |
| 11 | —CH$_3$ | —COOC$_2$H$_5$ |
| 12 | —CH$_3$ | —COOC$_2$H$_5$ |
| 13 | CH$_2$C(CH$_3$)$_2$—CH$_2$—C=O | |
| 14 | CH$_2$—CH$_2$—CH$_2$—C=O | |

TABLE

| Compound No. | $R_2$ | $R_4$ |
|---|---|---|
| 1 | —CH$_3$ | —COOCH$_3$ |
| 2 | —CH$_3$ | —COCH$_3$ |
| 3 | —CH$_3$ | —COOC(CH$_3$)$_3$ |
| 4 | —CH$_3$ | —COOC$_2$H$_5$ |
| 5 | —C$_{17}$H$_{35}$ | —COOC$_2$H$_5$ |
| 6 | —C$_6$H$_4$—OCH$_3$ | —COOC$_2$H$_5$ |

TABLE-continued

| Compound No. | $R_2$ | $R_4$ |
|---|---|---|
| 7 | —⟨phenyl⟩—NO$_2$ | —COOC$_2$H$_5$ |
| 8 | —C$_4$H$_9$ | —COOC$_2$H$_5$ |
| 9 | —CH$_3$ | —CN |
| 10 | —⟨cyclohexyl⟩ | —CO—⟨phenyl⟩ |
| 11 | —⟨thienyl, S⟩ | —CO—CF$_3$ |
| 12 |  | CH$_2$—CH$_2$—CH$_2$—C=O (ring) |
| 13 |  | CH$_2$—C(CH$_3$)$_2$—CH$_2$—C=O (ring) |
| 14 |  | CH$_2$—CH$_2$—CH$_2$—C=O (ring) |

The 1,4-dihydro-4-(5'-nitro-2'-furyl)-pyridines can be prepared according to the Hantzsch pyridine synthesis from 5-nitrofurfural, a β-ketrocarboxylic acid ester or a β-ketocarboxylic acid nitrile or a β-diketone and ammonia or a β-aminocrotonic acid ester (Elderfield, Heterocycl. Compounds, Vol. 1, 1950, p. 462 ff).

The synthesis of 1,4-dihydro-2,6-dimethyl-4-(5'-nitro-2'-furyl)-pyridine-3,5-dicarboxylic acid-di-tert.-butyl ester (compound 3 of the Table) is described as follows, other compounds being prepared analogously to this.

A solution of 24.4 g 5-nitrofurfural diacetate; 33.2 g acetoacetic acid-tert.-butyl ester; 5.0 g ammonium acetate; and 5.0 ml ammonia solution (25%) is heated for 6 hours in 40 ml pyridine to a vapor bath. After cooling, the solution is poured into 1 liter of ice water, and is allowed to stand overnight at 0° C. The separated precipitate is recrystallized 4 times from hot ethanol. 12 g of yellow needles are obtained having a melting point of 195° C.

To prepare the photosensitive recording elements, the 1,4-dihydro-4-(5'-nitro-2'-furyl)-pyridines with at least a known compatible organic polymeric binder, e.g., alkali soluble, are applied to a support, e.g., a film base according to a conventional coating process, e.g., dip coating, spin coating, coating with a doctor knife, spraying, etc. A large number of binders, e.g., alkali-soluble binders, are known which are suitable for the named purpose of application. These binders frequently contain alkali-soluble promoting groups, such as acid anhydrid-, carboxyl-, sulfonic acid groups and the like. As examples are named: acrylic acid and/or methacrylic acid polymers and/or their copolymers with other suitable monomers, e.g., acrylic acid esters or other acryl derivatives, vinyl compounds, such as vinyl ether, vinyl acetate or their saponification products, styrene, vinyl pyrrolidone, butadiene and related monomers; polyacrylic acid anhydrides, copolymers of maleic acid anhydride, maleic acid, maleic acid monoesters, -monoamides and/or anhydrides and derivatives of related compounds, e.g., itaconic acid, with suitable comonomers, e.g., styrene, ethylene, vinyl ethers, vinyl acetates, etc., polystyrene sulfonic acid and/or their copolymers; cellulose derivatives, such as, e.g., carboxymethyl cellulose, cellulose phthalate or -succinate, alginic acid and their derivatives. Additionally, phenol-formaldehyde resins known under the designation of Novolac ® are suitable.

Copolymers of maleic acid anhydride and styrene are especially advantageous polymeric binders for the preparation of elements according to the invention. The concentration of 1,4-dihydro-4(5'-nitro-2'-furyl)-pyridines is about 20 to 80% by weight based on the total weight of the photosensitive composition. The photosensitive compounds can be used alone or in mixture with one another. The concentration of the polymeric binder is about 20 to 80% by weight based on the total weight of the composition.

By the addition of an initiator or initiator system, the sensitivity of the layer can be improved. Suitable initiators are known from the literature, e.g., benzophenone, Michler's ketone, hexaaryl bis-imidazole, etc. Michler's ketone, p-dimethylamino-benzaldehyde, 5-nitroindazole, and nitroaniline have proved effective. The photosensitive layer can also contain suitable dyes and pigments as well as other additives, such as plasticizers, adhesive promoters, etc. The initiator or initiator system, if present, can be used in amounts up to 10% by weight based on the total composition weight.

As supports, one may use film bases customarily employed for the manufacture of photographic elements. Suitable supports are: paper, coated paper, foils and sheets of metal such as aluminum and copper, supports of synthetic polymeric materials such as polyethylene, polypropylene, polyesters, e.g., polyethylene terephthalate, and polyamides, as well as supports of cellulose acetate, cellulose butyrate, and cellulose acetatebutyrate. The photosensitive layer can be applied directly onto one of these supports and used in this form to prepare the relief image. It can also be first coated onto a temporary strippable support, preferably a transparent plastic film, and then transferred by lamination onto the support with which it will be used. The thickness of the photosensitive layer ranges from 10 to 150 μm or more.

The recording element can contain conventional intermediate layers, e.g., to anchor the photosensitive layer to its support. Dyes, pigments, or the like can be present in the support or in the intermediate layers.

To prepare the images, the photosensitive element is exposed imagewise by radiation sources which emit radiation rich in ultraviolet light, e.g., mercury vapor lamps, Xenon lamps, etc. The element is then developed by washing out of the exposed image portions. Preferably, for washout aqueous alkali solutions are used which can contain as suitable alkali, e.g., alkali carbonates, borates and alkali hydroxides, as well as the known carbonate-, borate- and phosphate-buffer systems. The washout solutions, moreover, can contain surface-active substances. Depending on the polymeric binder used, naturally, organic solvents can also be used for washout.

It is completely surprising and not obvious for those skilled in the art that the described 1,4-dihydro-4-(5'-nitro-2'-furyl)-pyridines are photosensitive compounds having such good properties. It is known from literature (J. Am. Chem. Soc. 77/1955, p. 447, lines 1–3 right column and remark 3), that photosensitivity is a function of the position of the nitro group in the molecule. Thus, the 1,4-dihydro-4-(2'-nitrophenyl)-pyridine of German OS 2,242,106 are described as photosensitive compounds, while the corresponding 3'- or 4'-nitro-derivatives, where the nitro group is not in the o-position for linking, are insensitive to light. Therefore, based on the position of the nitro group in the molecule, it is unexpected by those skilled in the art that the 1,4-dihydro-4-(5'-nitro-2'-furyl)-pyridines are photosensitive. It is also unexpected that photosensitive layers prepared from these compounds are superior to the compounds disclosed in German OS 2,242,106.

BEST MODE FOR CARRYING OUT THE INVENTION

The best mode is illustrated in Example 4 wherein an offset printing plate is prepared using Compound 3 of the Table, 1,4-dihydro-2,6-dimethyl-4-(5'-nitro-2'-furyl)pyridine-3,5-dicarboxylic acid-ditert.-butyl ester, and an alkali-soluble organic polymeric binder, a copolymer of styrene and maleic acid anhydride.

INDUSTRIAL APPLICABILITY

The photosensitive elements of the invention are especially suited for the preparation of printing plates, particularly offset printing plates, as well as in the preparation of printed circuits using an element having a strippable support. Transparent or opaque positive copies of line, screen, or halftone originals can also be prepared.

EXAMPLES

The following examples illustrate the invention wherein the percentages are by weight except where noted.

EXAMPLE 1

A casting solution of the following composition is applied to an aluminum plate, as it is used for the preparation of offset printing plates:

| | |
|---|---|
| 10.0 g | phenol formaldehyde resin (Alnovol ®) |
| 5.0 ml | glycol monomethyl ether |
| 0.1 g | of a blue triaryl methane dye (Victoria Pure Blue FGA ®) |
| 2.5 g | Compound 1 of Table |
| 0.25 g | p-dimethyl aminobenzaldehyde |
| 90.0 ml | acetone |

The thickness of the dried layer is 20 μm.

The plate is then exposed under an original phototool for 120 seconds at a distance of 60 cm using a mercury vapor lamp (1,000 W). The exposed image portions are then subsequently washed out using an aqueous solution of the following composition:

| | |
|---|---|
| 30 g | $Na_2CO_3$ Anh. |
| 30 g | $Na_3PO_4 \cdot 12 H_2O$ |
| 25 ml | NaOH (10%) |
| | Water to 1 liter. |

A positive-working offset printing plate of high life expectancy is obtained.

EXAMPLE 2

A photosensitive mixture of the following composition is applied to a polyethylene terephthalate film base, is dried, and is provided with a transparent removable cover film:

| | |
|---|---|
| 10.0 g | copolymer of methyl methacrylate (40 Mol%)/ethyl actylate (55 Mol%) in acrylic acid (5 Mol%) |
| 5.0 g | Compound 14 of Table |
| 0.1 g | of a mixture of triethylene glycol-di-n-hexanoic acid ester and triethylene glycol-di-n-octanoic acid ester (ratio 1:1) |
| 0.1 g | of a blue triaryl methane dye (Victoria Pure Blue FGA ®) dissolved in 100 ml methylene chloride. |

The coating thickness of the photosensitive layer after drying is 50 μm.

After the removal of the cover film the photosensitive layer is laminated onto a copper circuit board to form a photoresist as it is used for the preparation of printed circuits, and is exposed under an original phototool for 240 seconds using a mercury vapor lamp (1,000 W) at a distance of 60 cm. Development takes place using a solution of the following composition:

| | |
|---|---|
| 20 g | $Na_3PO_4 \cdot 12 H_2O$ |
| 20 ml | methyl glycol |
| | 1 liter water. |

The plate is then etched in conventional manner using a ferric chloride solution. After removal of the photoresist film a printed circuit of high quality is obtained.

Example 3

The casting solution A of the following composition is prepared:

| | |
|---|---|
| 9.0 g | phenol formaldehyde resin (Alnovol ®) |
| 4.5 g | Compound 4 of Table |
| 0.1 g | of a mixture of triethylene glycol-di-n-hexanoic acid ester and triethylene glycol-di-n-octanoic acid ester as in Example 2 |
| 0.1 g | of a blue triaryl methane dye (Victoria Pure Blue FGA ®) |
| 150.0 g | acetone |
| 20.0 g | ethylene glycol monoethyl ester |

A second casting solution B is prepared, which differs from solution A only in that it contains 4.5 g of Compound 2) of German OS 2,242,106 as the photosensitive compound.

Both casting solutions are applied to aluminum plates as they are used for the preparation of offset printing forms, to provide a coating thickness after drying of 20 μm. The elements formed are exposed as described in Example 1, and the exposed areas are washed out with a solution of the following composition:

| | |
|---|---|
| 20 g | $Na_2CO_3$ |
| 20 g | $Na_3PO_4 \cdot 12 H_2O$ |
| 3.3 g | NaOH |
| 20 ml | glycol monoethyl ether |
| | Water to 1 liter. |

The following results are obtained:

| | Plate A | Plate B |
|---|---|---|
| Start of image | | |

-continued

|  | Plate A | Plate B |
|---|---|---|
| formation | 20 seconds | 50 seconds |
| Completion of image formation | 50 seconds | 120 seconds |
| Dissolution of the layer | 150 seconds | 150 seconds |

As clearly seen from the results above, Plate A excels Plate B by a considerably wider processing latitude.

Example 4

A casting solution of the following photosensitive composition is applied to an aluminum plate, as it is used for the preparation of offset printing plates:

| 5.0 g | copolymer of styrene (50 Mol%) and maleic acid anhydride (50 Mol%) |
| 2.5 g | Compound 3 of Table |
| 100.0 ml | acetic acid ethyl ester. |

The coating thickness of the dried coating is 20 $\mu$m. The element is exposed as described in Example 2. The exposed image portions are subsequently dissolved out using a solution of the following composition:

| 20 g | $Na_2CO_3$ |
| 20 g | $Na_3PO_4 \cdot 12 H_2O$ |
| 3 g | NaOH |
| 20 ml | glycol monoethyl ether |
|  | Water to 1 liter. |

The following results are obtained:

| Start of image recording: | 20 seconds |
| Completion of image recording: | 50 seconds |
| Dissolution of the layer: | 200 seconds |

Example 5

A casting solution of the following composition is applied to a polyethylene terephthalate film base, the dry coating thickness of the cast coating is 10 $\mu$m:

| 5.0 g | copolymer of styrene and maleic acid monoester |
| 3.0 g | Compound 2 of Table |
| 0.5 g | of a red disazo dye, Ceres Red ® |
| 100.0 ml | methylene chloride |

After drying, the layer is exposed for 120 seconds at a distance of 60 cm using an ultraviolet lamp (1,000 W). The exposed layer portions are subsequently dissolved out using a solution of the following composition:

| 20 g | $Na_3PO_4 \cdot 12 H_2O$ |
| 20 ml | methyl glycol |
|  | Water to 1 liter. |

A red duplicate of the original on a transparent support is obtained.

Example 6

Onto a polyethylene terephthalate film base is applied a cast solution of the following composition which is then dried:

| 10.0 g | of a mixture of a copolymer of methyl methacrylate (40 Mol%), ethyl acrylate (55 Mol%, and acrylic acid (5 Mol%) and carbon black in the ratio 1:1 |
| 0.5 ml | of a mixture of triethylene glycol-di-n-hexanoic acid ester and triethylene glycol-di-n-octanoic acid ester as in Example 2 |
| 90.0 ml | acetone |

An additional layer of the following composition is then applied onto this layer:

| 10.0 g | of a copolymer of styrene (50 Mol%) and maleic acid anhydride (50 Mol%) |
| 2.5 g | Compound 3 of Table |
| 2.5 ml | triethylene glycol-di-n-hexanoic acid ester and triethylene glycol-di-n-octanoic acid ester as in Example 2 |
| 100.0 ml | acetic acid ethyl ester |

After drying the element is exposed for 2 minutes using an ultraviolet lamp (1,000 W) through a screen original.

After washing out the exposed points using a solution of the following composition:

| 20 g | $Na_3PO_4 \cdot 12 H_2O$ |
| 20 ml | methyl glycol |
|  | Water to 1 liter | a positive screen image is obtained.

What is claimed is:

1. A photosensitive element for the preparation of positive images which comprises a support bearing a photosensitive layer comprising at least one organic polymeric binder and a dihydropyridine compound, the improvement being that the dihydropyridine compound is of the formula

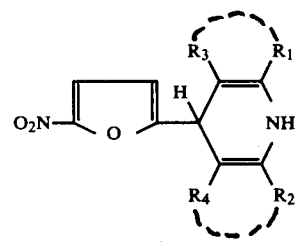

wherein
$R_1$ and $R_2$ are alkyl, aryl, substituted aryl and heterocyclic ring,
$R_3$ and $R_4$ are COOR', COR' and CN, R' is alkyl, substituted alkyl, or aryl,
and
$R_1$ and $R_3$ and/or $R_2$ and $R_4$ when taken together can form a 5- or 6-membered carbocyclic or heterocyclic ring.

2. An element according to claim 1 wherein the dihydropyridine compound is present in 20 to 80 percent by weight based on the total weight of the photosensitive layer.

3. An element according to claim 2 wherein an initiator is present in the photosensitive layer in an amount up to 10% by weight of the photosensitive layer.

4. An element according to claim 1 wherein the dihydropyridine compound is taken from the group of 1,4-dihydro-2,6-dimethyl-4-(5'-nitro-2'-furyl)-3,5-diacetopyridine, 1,4-dihydro-2,6-dimethyl-4-(5'-nitro-2'-furyl)-pyridine-3,5-dicarboxylic acid-di-tert.-butyl ester, and 1,4-dihydro-2,6-dimethyl-4-(5'-nitro-2'-furyl)-pyridine-3,5-dicarboxylic acid diethyl ester.

5. An element according to claim 1 wherein the photosensitive layer comprises as the photosensitive compound 1,4-dihydro-2,6-dimethyl-4-(5'-nitro-2'-furyl)pyridine-3,5-dicarboxylic acid-di-tert.-butyl ester and the organic polymer binder is a copolymer of maleic acid anhydride and styrene.

6. An element according to claim 2, 3, 4 or 5, wherein said organic polymer binder is alkali soluble.

* * * * *